United States Patent [19]

Scott et al.

[11] Patent Number: 4,777,147
[45] Date of Patent: Oct. 11, 1988

[54] FORMING A SPLIT-LEVEL CMOS DEVICE

[75] Inventors: David B. Scott, Plano; Satwinder S. Malhi, Garland, both of Tex.

[73] Assignee: Texas Instruments Incorporated, Dallas, Tex.

[21] Appl. No.: 139,536

[22] Filed: Dec. 30, 1987

Related U.S. Application Data

[60] Division of Ser. No. 9,004, Jan. 28, 1987, which is a continuation of Ser. No. 573,529, Jan. 24, 1984, abandoned.

[51] Int. Cl.[4] .............................................. H01L 21/36
[52] U.S. Cl. ...................................... 437/57; 437/174
[58] Field of Search .................................. 437/57, 174

[56] References Cited

U.S. PATENT DOCUMENTS

| 4,333,099 | 6/1982 | Tanguay et al. | 357/59 |
| 4,472,729 | 9/1984 | Shibata et al. | 357/59 |
| 4,637,127 | 1/1987 | Kuragi et al. | 437/57 |

FOREIGN PATENT DOCUMENTS

| 97384 | 8/1979 | Japan | 357/23.7 |
| 43455 | 3/1982 | Japan | 357/42 |

Primary Examiner—George T. Ozaki
Attorney, Agent, or Firm—Rodney M. Anderson; Leo N. Heiting; Melvin Sharp

[57] ABSTRACT

A method for forming CMOS device wherein the NMOS devices are bulk devices and the PMOS devices are SOI devices. The PMOS devices are formed with their channel regions in a silicon-on-insulator layer, preferably a laterally recrystallized annealed-polysilicon layer over a silicon dioxide layer.

16 Claims, 2 Drawing Sheets

FORMING A SPLIT-LEVEL CMOS DEVICE

This is a division of application Ser. No. 008,004, filed Jan. 28, 1987, which is a continuation of Ser. No. 573,529, filed Jan. 24, 1984 now abandoned.

BACKGROUND AND SUMMARY OF THE INVENTION

The present invention relates to CMOS devices.

Latch-up has been a chronic problem in the CMOS art, and is predicted to become a much greater problem as CMOS devices are reduced to smaller and smaller dimensions. Latch-up results from the operation of a parasitic bipolar device, i.e. a bipolar device which is not intentionally designed as part of the circuit, but which in fact results from the device structures as fabricated. For example, in N-well CMOS technology, an N+ source/drain region and a P+ source/drain region will be separated by a portion of the N-well and of the P-substrate. This NPNP device can be considered as a thyristor, and, with the small device spacing which is preferable for integrated circuits, this NPNP device will in fact fire as a thyristor at levels of injection current which may easily be achieved. Thus, any time a large potential difference exists between neighboring N+ and P+ regions, the parasitic thyristor may turn on and pass very large currents, which may cause a stuck logic condition or may destroy the CMOS device. This condition is known as latch-up.

The prior art has sought to reduce the gain of the parasitic thyristor or to avoid its ever getting a sufficient injection current to turn on. However, the present invention avoids latch-up in a new way: in the present invention, the parasitic thyristor does not exist, since the N-channel and P-channel devices are not both fabricated in the substrate.

That is, in the present invention one device type (preferably the PMOS) is fabricated as SOI devices rather than as bulk devices. This means that the NMOS and PMOS devices do not in general share this same substrate. Thus, although a diode may exist where the P+ regions butt up against the N+ regions, there is no current path for a thyristor structure to exist.

In particular, in the presently preferred embodiment, well implants into the bulk are not necesssary. Thus it is possible to use the P+ and N+ regions as conductors, and a P+ to N+ contact requires only a merged contact with a spot of metal to bridge the P+ to N+ diode. Since thyristor action is prevented, and PMOS and NMOS devices can be placed closer together higher total density results.

According to the present invention there is provided:
A CMOS integrated circuit, comprising:
a monolithic semiconducting substrate;
a plurality of N-channel insulated-gate-field-effect transistors formed in said substrate;
a plurality of P-channel silicon-on-insulator insulated-gate-field-effect transistors formed atop said substrate; and
means for interconnecting said N-channel and P-channel transistors to embody a predetermined circuit function.

BRIEF DESCRIPTION OF THE DRAWINGS

The present invention will be described with reference to the accompanying drawings, which are hereby incorporated by reference as a portion of the present specification, wherein.

DESCRIPTION OF THE PREFERRED EMBODIMENTS

The presently preferred embodiment will be described first in some detail, and modifications thereof will then be discussed.

Figure 1:
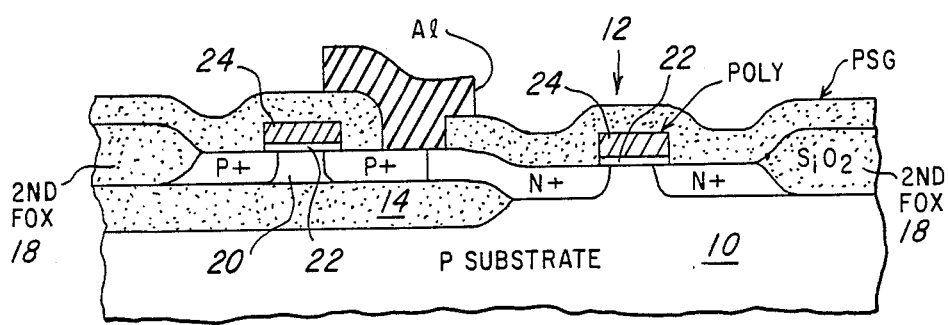
FIG. 1 shows a sample SOI CMOS device of the present invention.

A single-crystalline silicon substrate 10 is provided in FIG. 1. The doping of the substrate is unimportant, but will be discussed below.

Figure 2A:
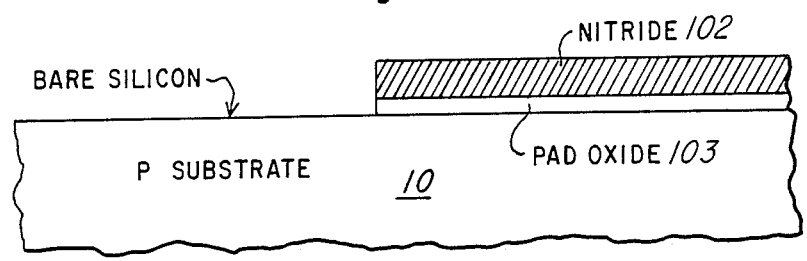
FIGS. 2a through 2e show successive steps in fabrication of the embodiment of FIG. 1.
Figure 2B:
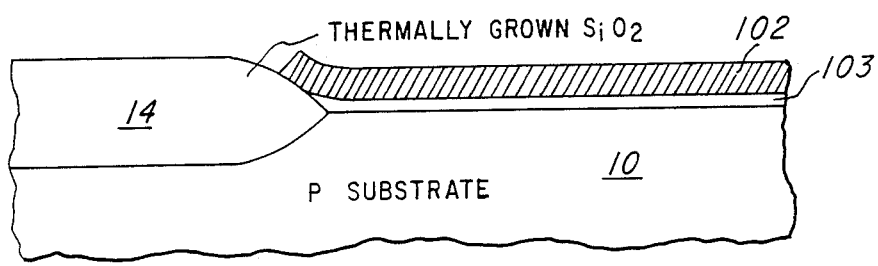
Figure 2C:
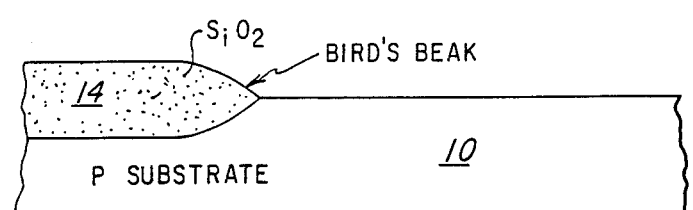

First, the moat regions 12 are provided, preferably by conventional LOCOS. For example, a thin oxide may be grown for stress relief, a nitride layer deposited and patterned in FIG. 2a, a channel stop ion implant (not shown) performed (e.g., $4 \times 10^{12}$ per square centimeter of boron at fairly low energy), and the first field oxide 14 grown in FIG. 2b. The first field oxide can be grown in a wide range of thicknesses, e.g., $\frac{1}{2}$ to 1.1 microns. In FIG. 2c, the nitride layer is stripped.

Figure 2D:
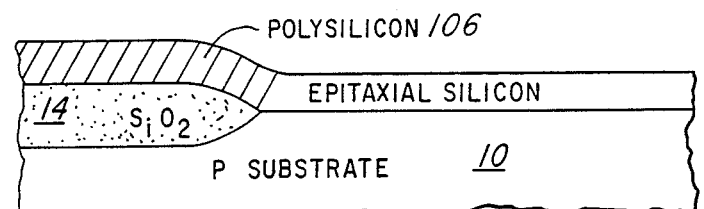

A first polysilicon layer 16, comprising undoped polysilicon, is then deposited (FIG. 2d). In the presently preferred embodiment this is about a half micron of polycrystalline silicon. This is deposited by chemical vapor deposition methods, as well known to those skilled in the art.

Note that this polysilicon layer 16 is both in contact with the substrate 10 and also runs up over the field oxide 14 (FIG. 1). For this reason, it is desirable that the first field oxide 14 be fabricated by LOCOS methods, to achieve a smooth transition of the polysilicon from the substrate up onto the field oxide 14. The thickness of the nitride mask is preferably 140 nanometers, but may be varied.

This polysilicon layer is then annealed to form device quality silicon. This is done preferably using the following annealing conditions, although a wide variety of others may be used, as is well known to those skilled in the art: a scanning argon ion laser, having a total power of about 10 in over a spot size about 80 microns wide, is scanned at 10 cm/sec. Alternatively, amorphous silicon can be deposited followed by a solid-phase-epitaxy anneal (e.g., at 600 degrees C.) to achieve recrystallization.

Figure 2E:
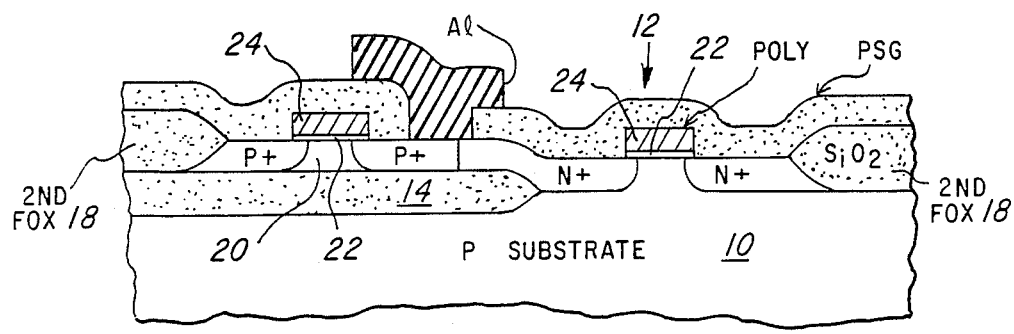

Next, the second field oxide 18 (FIG. 2e) is grown, for isolation of PMOS devices from each other, and for isolation of PMOS from NMOS devices. This second field oxide layer 18 is again preferably grown by LOCOS methods. However, the small thickness of the polysilicon layer 16 means that the second field oxide will only be grown to a moderate thickness, e.g. 1.1 microns, since the polysilicon layer 16 must be consumed to provide the oxide for this second field oxide.

Next, a masked implant is preferably performed to dope the channel regions 20 of the PMOS devices. This implant may be, for example, $5 \times 10^{11}$ per square centimeter of phosphorus. Next, a blanket implant is preferably performmed to adjust the threshold voltages of both the NMOS and PMOS devices. This implant would typically be 2 or $3 \times 10^{11}$ per square centimeter of boron.

Next, a gate oxide 22 is preferably grown over both the NMOS and PMOS devices. In the presently preferred embodiment, this gate oxide 22 is grown 500 angstroms thick. This thickness can of course be widely varied, as is well known to those skilled in the art. Preferably, as is also well known, a sacrificial oxide may be grown and then etched away before the gate oxide is grown.

Next the second poly layer 24 is deposited, doped, and patterned, to provide the gates of the NMOS and PMOS devices. This second polysilicon layer may be, for example, ½ micron thick, and POCl$_3$ doped to provide good conductivity. The remainder of the processing is essentially conventional. That is, source/drain ion implants are performed (either separately, using 2 masks, or using source/drain counter doping, using 1 mask). An interlevel insulator, such as PSG is deposited and preferably planarized. Another mask level is used for contacts, another mask level is used for metal, and another mask level is used for an overcoat (also referred to as POR).

The foregoing process flow does not provide first contacts, but those can easily be added if desired, simply by inserting a extra mask level.

The presently preferred embodiment places the PMOS devices on the oxide and the NMOS devices in bulk. This is because of the sign of the trapped charge Qss at the oxide interface. The sign of this trapped charge means that back interface leakage problems will be seen in the NMOS devices, if they are directly fabricated as SOI devices. However, if the trapped charge can be reduced, it would be possible to have the NMOS devices on the oxide and the PMOS devices in bulk, or even to have a mixed structure in which both NMOS and PMOS devices were found over the oxide. Although this is not presently believed to be desirable, it is a permitted embodiment of the invention.

It should be noted that the feature of depositing undoped polysilicon on the substrate, which is then doped to provide the desired channel doping, means that the substrate doping is not very important. That is, the substrate doping can essentially be selected primarily for gettering considerations. However, if the substrate is very heavily doped, then substrate dopants will migrate into the polysilicon layer during the annealing step.

Note that, in the presently preferred embodiment, lateral seeding is provided during the polysilicon annealing step. That is, the portion of the first polysilicon layer 16 which is directly in contact with the substrate 10 will freeze before the remainder of the layer 16, because silicon is so much better a thermal conductor then silicon oxide is. This portion of the layer 16, as is well known, will tend to freeze out epitaxially, i.e. into a silicon lattice which is aligned with a silicon lattice in the substrate 10. This crystalline portion of the layer will then laterally seed the remainder of the layer, so that a region of monocrystalline silicon will extend out onto the field oxide 14. This means that the channel regions 20 of the PMOS devices can be fabricated to be device quality.

Note that it may be desirable to impose a design limitation on the maximum distances between an active PMOS channel region 20 and the nearest boundary of a moat region 12, since the lateral seeding will not propagate single crystalline material across unlimited distances. However, regions of large-grain polycrystalline annealed silicon which are remote from the moat areas 12 can still be used, e.g., for capacitor plates.

What is claimed is:

1. A method of forming a CMOS integrated circuit, comprising:
   (a) providing a single crystal silicon substrate;
   (b) forming a first field oxide region in said substrate to provide a moat region;
   (c) forming a polysilicon layer over said moat region in contact with said substrate and extending over and in contact with said first field oxide region;
   (d) converting all of said polysilicon layer to single crystal type;
   (e) forming a channel region of a first conductivity type in said polysilicon layer over said first field oxide region;
   (f) forming a channel region of opposite conductivity type in said polysilicon layer over said moat region; one of the source/drain regions of said last mentioned device extending over said first field oxide; and
   (g) forming gate regions over and insulated from said channel region.

2. The method of claim 1 wherein step (b) is formed by local oxidation of silicon (LOCOS).

3. The method of claim 2 wherein said polysilicon layer in step (c) is undoped.

4. The method of claim 3 wherein step (d) comprises annealing of said polysilicon layer.

5. The method of claim 4 wherein said first conductivity type is N-type and said opposite conductivity type is P-type.

6. The method of claim 3 wherein said first conductivity type is N-type and said opposite conductivity type is P-type.

7. The method of claim 2 wherein step (d) comprises annealing of said polysilicon layer.

8. The method of claim 7 wherein said first conductivity type is N-type and said opposite conductivity type is P-type.

9. The method of claim 2 wherein said first conductivity type is N-type and said opposite conductivity type is P-type.

10. The method of claim 1 wherein said polysilicon layer in step (c) is undoped.

11. The method of claim 10 wherein step (d) comprises annealing of said polysilicon layer.

12. The method of claim 11 wherein said first conductivity type is N-type and said opposite conductivity type is P-type.

13. The method of claim 10 wherein said first conductivity type is N-type and said opposite conductivity type is P-type.

14. The method of claim 1 wherein step (d) comprises annealing of said polysilicon layer.

15. The method of claim 14 wherein said first conductivity type is N-type and said opposite conductivity type is P-type.

16. The method of claim 1 wherein said first conductivity type is N-type and said opposite conductivity type is P-type.

* * * * *